US012696389B2

(12) United States Patent
Mirpuri

(10) Patent No.: US 12,696,389 B2
(45) Date of Patent: Jul. 28, 2026

(54) REUSABLE MODULAR SUBSTRATE

(71) Applicant: NXP USA, Inc., Austin, TX (US)

(72) Inventor: Kabir Mirpuri, Scottsdale, AZ (US)

(73) Assignee: NXP USA, INC., Austin, TX (US)

( * ) Notice: Subject to any disclaimer, the term of this patent is extended or adjusted under 35 U.S.C. 154(b) by 332 days.

(21) Appl. No.: 18/235,300

(22) Filed: Aug. 17, 2023

(65) Prior Publication Data

US 2025/0063657 A1     Feb. 20, 2025

(51) Int. Cl.
*H05K 1/11*     (2006.01)
*H10W 70/685*     (2026.01)

(52) U.S. Cl.
CPC .......... *H05K 1/112* (2013.01); *H10W 70/685* (2026.01); *H05K 2201/083* (2013.01); *H05K 2201/09645* (2013.01)

(58) Field of Classification Search
CPC .......... H05K 1/112; H05K 1/181; H05K 1/11; H05K 2201/049; H05K 2201/083; H05K 2201/09645; H05K 2201/10378; H05K 2203/176; H05K 3/325; H10W 70/685; H10W 72/0198; H10W 72/072; H10W 72/20
USPC ........................................ 174/260
See application file for complete search history.

(56) References Cited

U.S. PATENT DOCUMENTS

| | | | |
|---|---|---|---|
| 7,902,038 B2 | 3/2011 | Aspar et al. | |
| 9,656,440 B2 | 5/2017 | van Neer et al. | |
| 2002/0113324 A1* | 8/2002 | Cordes .................. | H10W 70/05 |
| | | | 257/784 |
| 2008/0001271 A1 | 1/2008 | Marcinkiewicz | |
| 2014/0240936 A1* | 8/2014 | Kobayashi ........... | H05K 1/0233 |
| | | | 361/760 |
| 2018/0019194 A1 | 1/2018 | Papillon | |
| 2020/0119490 A1* | 4/2020 | Weis ..................... | H01R 12/716 |

\* cited by examiner

*Primary Examiner* — Timothy J Thompson
*Assistant Examiner* — Guillermo J Egoavil

(57)     ABSTRACT

A device may include a substrate having a plurality of laminated layers and a plurality of electrical interconnect pads on an outer surface of the plurality of laminated layers. The substrate may include a first plurality of magnetic material deposits on the outer surface of the plurality of laminated layers. A device may mount to the substrate. The device includes an electronic component including a plurality of terminals, and a base including a plurality of through-hole. A second plurality of magnetic material deposits may be on a second surface of the base. When the device is coupled to the substrate, each magnetic material deposit of the first plurality of magnetic material deposits is attracted by a magnetic force to a magnetic material deposit of the second plurality of magnetic deposits.

16 Claims, 8 Drawing Sheets

REUSABLE MODULAR SUBSTRATE

TECHNICAL FIELD

The disclosure generally relates to substrates for electronic devices and, more specifically, to a device substrate that enables surface mounting of electrical components via magnetic coupling.

BACKGROUND

The general trend in the electronics packaging technology is toward miniaturization both of discrete components and integrated circuits (ICs). A good example is in the notebook and sub-notebook computer field. As more functions are integrated on an IC, more connections off the chip are required, and more circuit traces are needed to interconnect them.

In response, newer device mounting technologies, such as surface mount technology (SMT), have enabled increased densities of devices to be mounted to printed circuit board (PCB) s. As device density has increased, there has been a concurrent reduction in conductor line (trace or line ratio) width in PCBs, and, eventually, an increase in the number of conductor layers formed within multilayer PCBs.

These advanced device-mounting and packaging techniques can require the use of high-density laminate substrates that exploit wirebond and/or flip chip interconnect technologies to achieve desired device densities. The manufacturing processes for these types of substrates can be complex and expensive. For example, the construction of such substrates may involve the use of lithography laser drilled holes, which can significantly add to the manufacturing cost of the substrates. In fact, in many devices, almost anywhere from a third to a half of the cost of final device assembly can be attributed to the cost of the device's substrate.

SUMMARY

This Summary section is neither intended to be, nor should be, construed as being representative of the full extent and scope of the present disclosure. Additional benefits, features and embodiments of the present disclosure are set forth in the attached figures and in the description hereinbelow; and as described by the claims. Accordingly, it should be understood that this Summary section may not contain all of the aspects and embodiments claimed herein.

Additionally, the disclosure herein is not meant to be limiting or restrictive in any manner. Moreover, the present disclosure is intended to provide an understanding to those of ordinary skill in the art of one or more representative embodiments supporting the claims. Thus, it is important that the claims be regarded as having a scope including constructions of various features of the present disclosure insofar as they do not depart from the scope of the methods and apparatuses consistent with the present disclosure (including the originally filed claims). Moreover, the present disclosure is intended to encompass and include obvious improvements and modifications of the present disclosure.

In some aspects, the techniques described herein relate to a system, including: a multi-layer printed circuit board (PCB), including: a plurality of laminated layers, a plurality of electrical interconnect pads on an outer surface of the plurality of laminated layers, and a first plurality of magnetic material deposits on the outer surface of the plurality of laminated layers; and a device coupled to the PCB, wherein the device includes: an electronic component including a plurality of terminals, a base including a plurality of through-hole vias, wherein each through-hole via of the plurality of through-hole vias is electrically connected to a terminal of the plurality of terminals, wherein the electronic component is mounted to a first surface of the base, and a second plurality of magnetic material deposits on a second surface of the base, wherein the second surface is opposite the first surface, wherein when the device is coupled to the PCB, each magnetic material deposit of the first plurality of magnetic material deposits is attracted by a magnetic force to a magnetic material deposit of the second plurality of magnetic deposits and each through-hole via of the plurality of through-hole vias is electrically connected to an electrical interconnect pad of the plurality of electrical interconnect pads, wherein at least one of the magnetic material deposits of the first plurality of magnetic material deposits and the magnetic material deposits of the second plurality of magnetic material deposits includes a permanent magnetic material.

In some aspects, the techniques described herein relate to a device, including: an electronic component including a plurality of terminals, a base including a plurality of through-hole vias, wherein each through-hole via of the plurality of through-hole vias is electrically connected to a terminal of the plurality of terminals, wherein the electronic component is mounted to a first surface of the base, and a first plurality of magnetic material deposits on a second surface of the base, wherein the second surface is opposite the first surface, wherein the device is configured to couple to a substrate, wherein: the substrate includes a plurality of electrical interconnect pads on an outer surface of the substrate, and a second plurality of magnetic material deposits on the outer surface of the substrate, when the device is coupled to the substrate, each magnetic material deposit of the first plurality of magnetic material deposits is attracted by a magnetic force to a magnetic material deposit of the second plurality of magnetic deposits and each through-hole via of the plurality of through-hole vias is electrically connected to an electrical interconnect pad of the plurality of electrical interconnect pads, and at least one of the magnetic material deposits of the first plurality of magnetic material deposits and the magnetic material deposits of the second plurality of magnetic material deposits includes a permanent magnetic material.

In some aspects, the techniques described herein relate to a device, including: a substrate, including: a plurality of laminated layers, a plurality of electrical interconnect pads on an outer surface of the plurality of laminated layers, and a first plurality of magnetic material deposits on the outer surface of the plurality of laminated layers.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure.

In the drawings.

DETAILED DESCRIPTION OF THE ILLUSTRATED EMBODIMENTS

Figure 1:
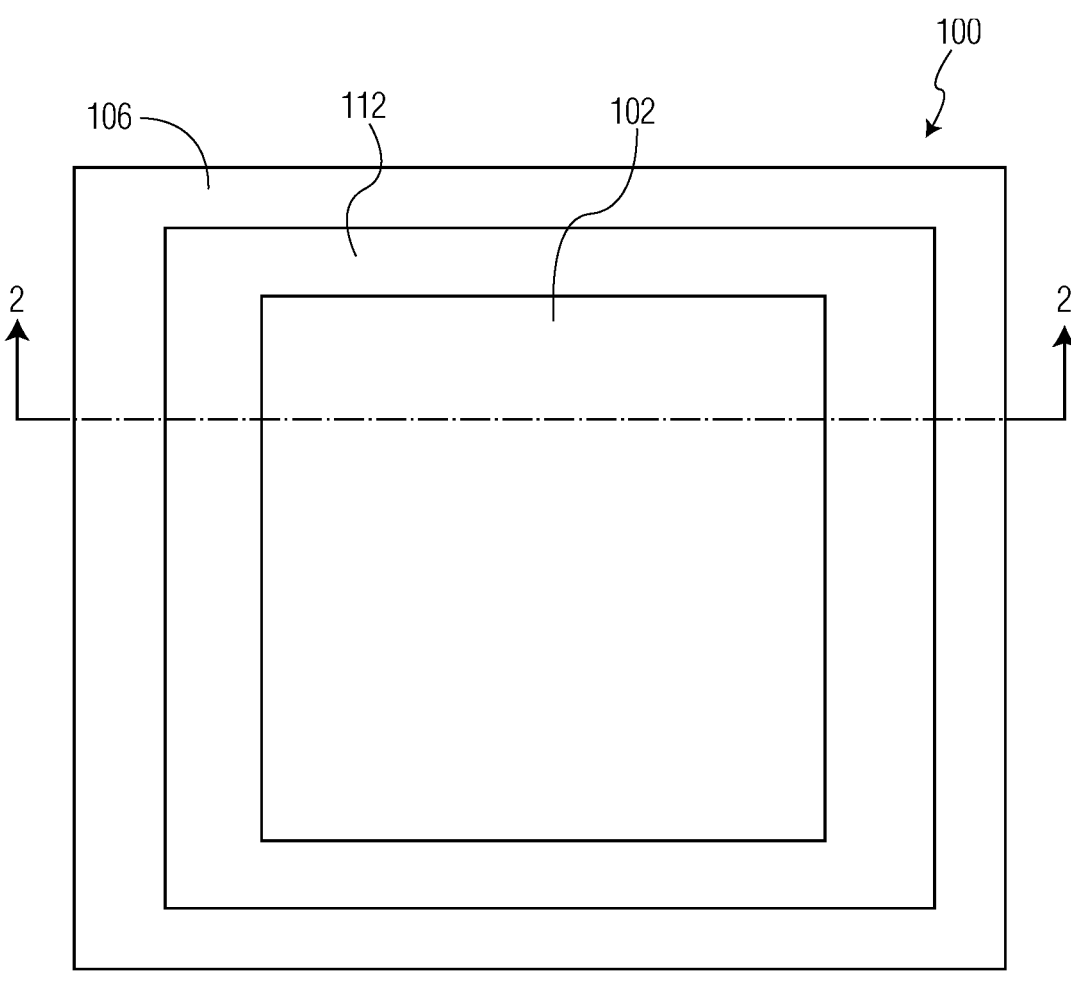
FIG. 1 illustrates a top view of a semiconductor package device.

The present disclosure generally relates to substrates for electronic devices and, more specifically, to a device substrate that enables surface mounting of electrical components via a magnetic coupling.

The present disclosure provides systems and methods that enable the reuse of the complex multilayer substrates that form the backbone of modern electronic devices. A semiconductor device package includes a semiconductor die mounted to a laminar package base. In accordance with the present disclosure, magnetic material is formed in a prearranged pattern over an outer surface (e.g., bottom surface) of the base of the semiconductor package. The magnetic material on the semiconductor package is configured to complement a similar arrangement of magnetic material deposited or formed over a surface of the substrate (e.g., a multilayer PCB) of the electronic device. The semiconductor package can then be mounted to the substrate in a manner such that various contact terminals of the semiconductor package are placed into electrical communication with corresponding landing pads formed on a surface of the device substrate. In that arrangement, the magnetic materials formed on the base of the semiconductor package are put into proximity with the complementary magnetic materials formed on the device package such that a magnetic attractive generated therebetween operates to secure the semiconductor package to the device substrate and maintain the contact terminals and landing pads in physical contact.

In the event that the electronic device is ultimately to be repaired or recycled, the semiconductor package can easily be removed from the device substrate via mechanical force that overcomes the attractive magnetic force. With the semiconductor package removed, the substrate can be reused, such as by replacing the semiconductor package with another similarly-configured semiconductor package (e.g., in the event that the original semiconductor package has failed) or with a different semiconductor package having a complementary arrangement of magnetic material patterns and contact terminals (e.g., in the event that the original semiconductor package is being upgraded or the device substrate is being utilized within a different type of device).

In this arrangement, once the semiconductor package reaches its end of life, the package can be replaced with a next generation module, which may include a modified or upgraded semiconductor die, but the same general contact terminal layout. Additionally, the present disclosure contemplates that similar techniques may be used to implement magnetically mounted module-based passive devices (e.g., capacitor, inductors, resistors, and combinations thereof) that can likewise be attached or detached magnetically from a device substrate.

In some specific embodiments of the present disclosure, the device substrate may be configured with a pattern of magnetic materials and landing pads enabling multiple different types of semiconductor packages and/or discrete component packages to be mounted to the substrate. In that manner, the substrate may be configured as a generic substrate usable in a number of different electronic devices. For example, a single substrate may be configured to enable the mounting, via magnetic forces, of multiple semiconductor and passive device packages in which the various packages may have different aspect ratios and/or contact terminal layouts. Thus, the same substrate can be reused for multiple products, potentially saving cost, and providing some protection against supply-chain issues that may make new substrates unavailable.

Figure 2:
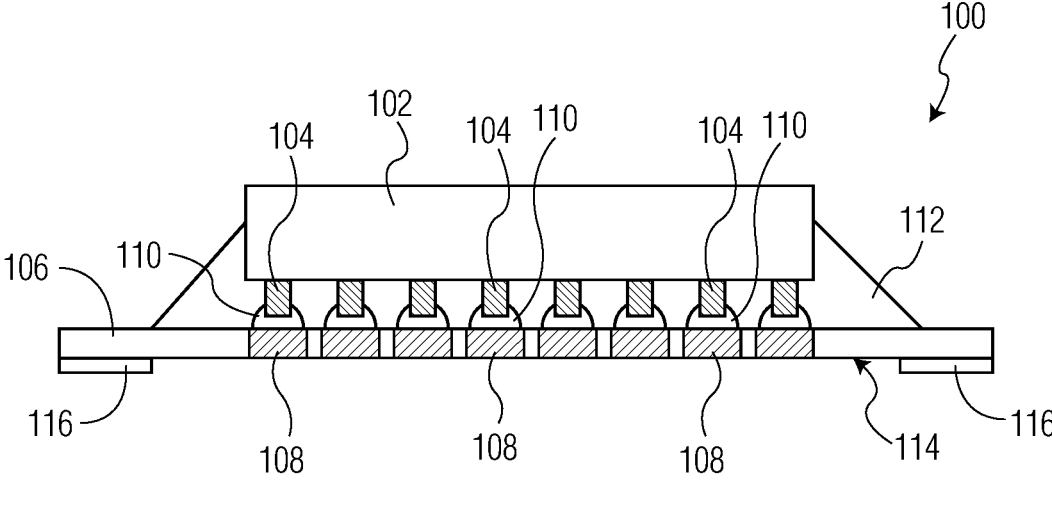
FIG. 2 shows a cross-sectional view of the semiconductor package device of FIG. 1.
Figures 3, 4:
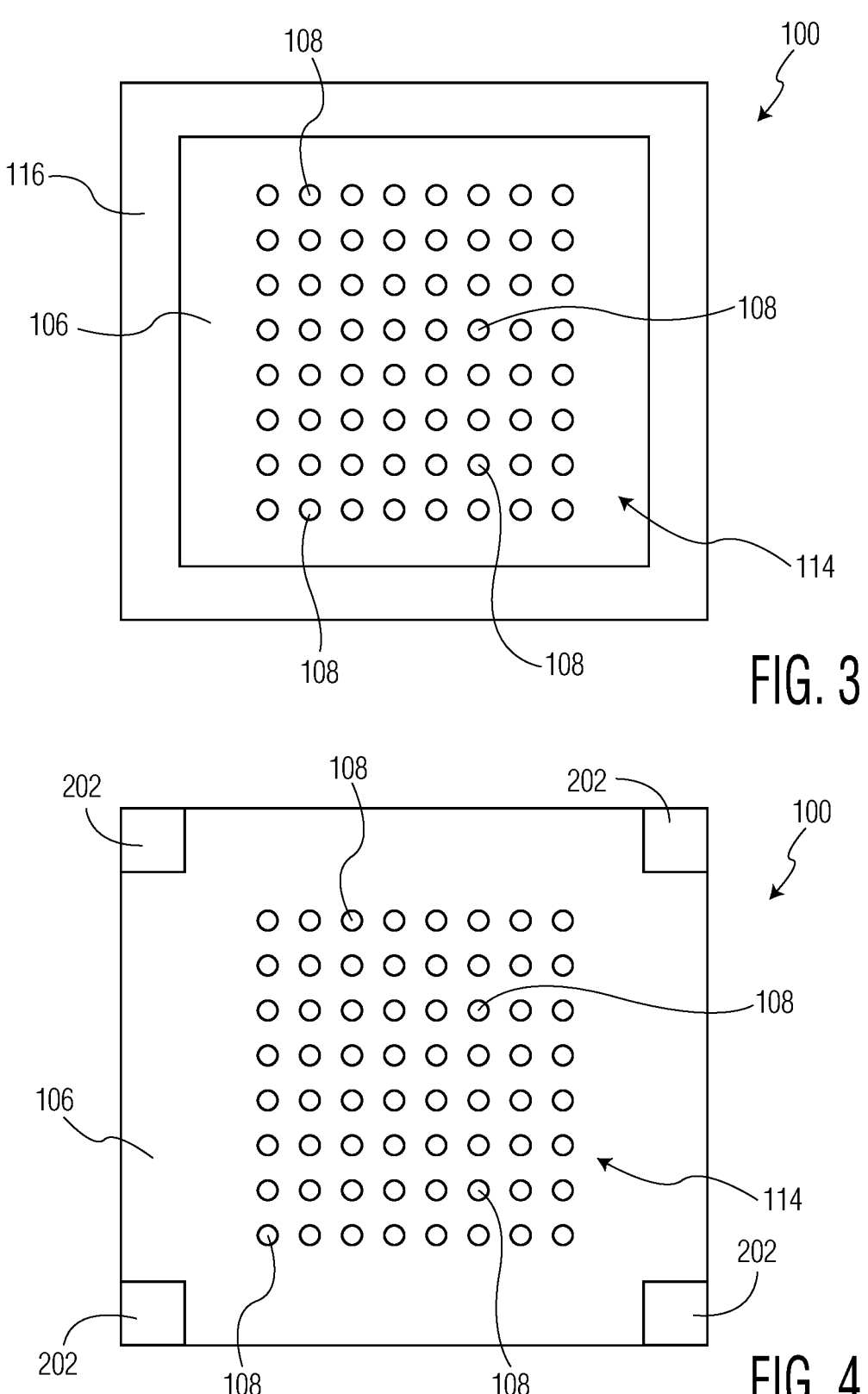
FIG. 3 shows a bottom view of semiconductor package device 100.
FIG. 4 is a bottom view of an alternative embodiment of a semiconductor package device in which magnetic material has been deposited on the corners of the bottom surface of the package base.

FIGS. 1-3 depict various views of a semiconductor package device 100. FIG. 1 illustrates a top view of semiconductor package device 100. FIG. 2 shows a cross-sectional view of semiconductor package device 100 taken along line 2-2 of FIG. 1. FIG. 3 shows a bottom view of semiconductor package device 100.

Semiconductor package device 100 includes a semiconductor die 102 (shown in FIGS. 1 and 2) that represents the primary functional component of semiconductor package device 100. In the embodiment illustrated in FIGS. 1-3, semiconductor die 102 includes a single die, however in other embodiments semiconductor package device 100 may include a plurality of semiconductor die that are interconnected to one another. As shown in FIG. 2, a bottom surface of semiconductor die 102 includes a plurality of conductive terminals 104 enabling external components to be put into electrical communication with the internal circuits formed within semiconductor die 102.

Within semiconductor package device 100, semiconductor die 102 is mounted to package base 106. Package base 106 generally includes a substrate material such as a single layer PCB or polymer dielectric.

A number of through-holes are formed in package base 106, such as by etching and/or laser drilling, or punching. Conductive material, such as copper, gold, or other metals, are disposed within the various through-holes to form several through-hole vias 108, which are shown in FIGS. 2 and 3. Through-hole vias 108 are connected to respective conductive terminals 104 via solder bumps 110. Alternatively, through-hole vias 108 could be connected to conductive terminals 104 via copper (Cu) pillars emanating from semiconductor die 102. In some embodiments, thermocompression bonding (TCB) or mass reflow could be used to attach semiconductor die 102 to the through-hole vias 108 in package base 106.

Semiconductor die 102 is further connected to package base 106 via underfill 112 that is disposed at least partially between semiconductor die 102 and package base 106. Underfill 112 may include any suitable non-conductive die-attach material, such as Si fillers within the polymeric base.

Although not shown in FIGS. 1-3, an encapsulant material may be deposited over semiconductor die 102 and package base 106 to encapsulate semiconductor die 102 (e.g., to provide environmental protection or electromagnetic or thermal isolation to semiconductor die 102).

As illustrated in FIG. 3 a magnetic deposit 116 is formed over a bottom surface 114 of package base 106 (e.g., via sputtering, evaporation, electroplating, or any other suitable deposition technique). Magnetic deposit 116 includes magnetic material, which may include Nickel, Iron, Cobalt, samarium Cobalt, and/or rare-earth materials such as neodymium.

In the depicted embodiment, magnetic deposit 116 is disposed about a perimeter of package base 106, however as described herein magnetic deposit 116 may be deposited in different shapes and/or patterns. For example, FIG. 4 is a bottom view of an alternative embodiment of semiconductor package 100 in which magnetic material 202 has been deposited only on the corners of the bottom surface 114 of package base 106. In other embodiments, the magnetic material 202 may be deposited so as to surround one or more of the semiconductor package 100 through-hold vias.

As described herein, semiconductor package device 100 is configured to be mounted to a device substrate (e.g., a multilayer PCB). When mounted, the through-hole vias 108 of semiconductor package device 100 are put into electrical communication with complementary contact pads on the device substrate. In such a configuration, magnetic deposits 116 of semiconductor package device 100 are placed into proximity with complementary magnetic deposits formed over the device substrate. The magnetic deposits on the package base 106 of semiconductor package device 100 are thereby attracted to the magnetic deposits on the device substrate, which creates an attractive force that holds or couples semiconductor package device 100 to the substrate within the several through-hole vias 108 of semiconductor package device 100 being maintained in electrical contact with the landing pads of the substrate.

Figure 5:
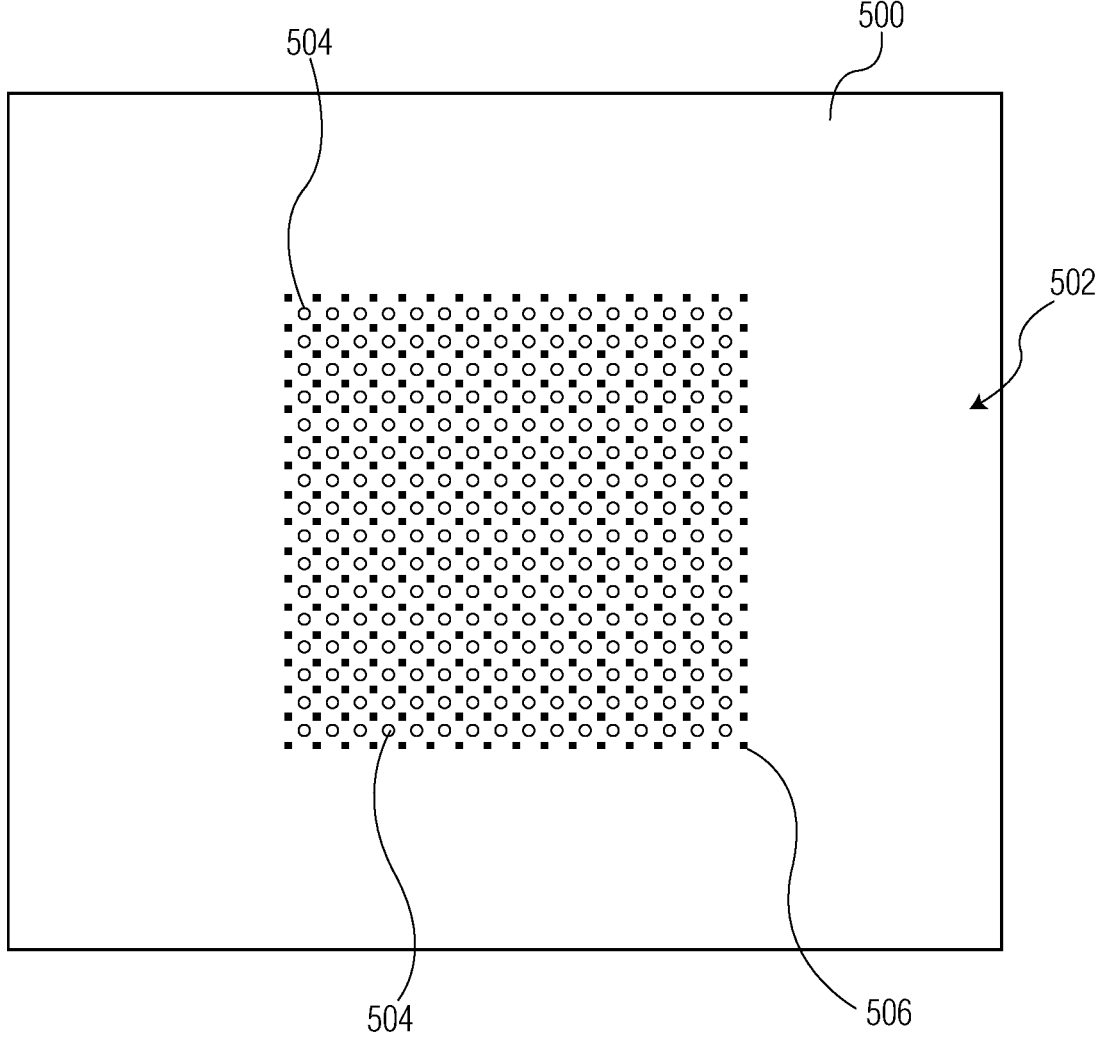
FIG. 5 depicts a device substrate that may be utilized in conjunction with the semiconductor package device of FIGS. 1-3.

To illustrate, FIG. 5 depicts an example device substrate 500 that may be utilized in conjunction with the semiconductor package device 100 of FIGS. 1-3. As depicted in FIG. 5, substrate 500 may include a multi-layered board (MLB) PCB. Typically, MLBs have three or more circuit layers formed within the body of the circuit board. In such a board, networks of passive circuit elements can be deposited in predetermined geometric patterns on surfaces of insulating substrates of the MLB. The substrates are later joined to provide a single board structure with multiple layers of circuitry.

MLBs may be manufactured by bonding, or laminating, the various layers of patterned, pre-etched, plated-through-hole, copper-clad laminates together. A plated through hole is the electrical pathway for interconnection of "buried" layered circuits within an MLB. A typical MLB is made up of successive layers of conductive circuits that have typically been phototactically traced and chemically etched, epoxy-resin-glass dielectrics, and epoxy-glass that has been dried and partially cured over a PCB. This partially cured epoxy-glass serves as the bonding material (glue or prepreg) to hold the various layers of the MLB together.

PCB substrate material is an important part of overall structural integrity for any MLB and must closely match the conductive trace layer's thermal expansion rate. Consequently, the dielectric constant of the substrate is one factor determining the board's required conductive trace width. The trace width is the physical dimension measured across one conductive circuit path in the plane of the printed circuit board. Each individual circuit trace is the electrical pathway to one of many circuits to one or more electrical components.

Referring to FIG. 5, a number of landing pads 504 are formed over surface 502 of device substrate 500. Landing pads 504 include conductive material and may be electrically connected to the various traces, circuits, and other electrical components formed on, within, or connected to device substrate 500. Typically, landing pads 504 include a conductive metal, such as copper or gold, although landing pads 504 may comprise other conductive materials, and combinations thereof.

Additionally, magnetic deposits 506 are formed over surface 502 of device substrate 500. In the embodiment depicted in FIG. 5, magnetic deposits 506 are deposited in a predetermined pattern such that magnetic deposits 506 are intermingled with the various landing pads 504 of device substrate 500. Magnetic deposits 506 may include any suitable magnetic material, such as Nickel, Iron, Cobalt, samarium Cobalt, and/or rare-earth materials such as neodymium.

In this configuration, a semiconductor package (e.g., semiconductor package device 100) can be mounted to surface 502 of device substrate 500 so that the package is maintained in position by the magnetic attractive forces formed by magnetic deposits 506 on device substrate 500 and the complementary magnetic deposits formed on the base of the semiconductor package such that the through-hole vias of the package are maintained in electrical connection with landing pads 504 of device substrate 500.

Figure 6:
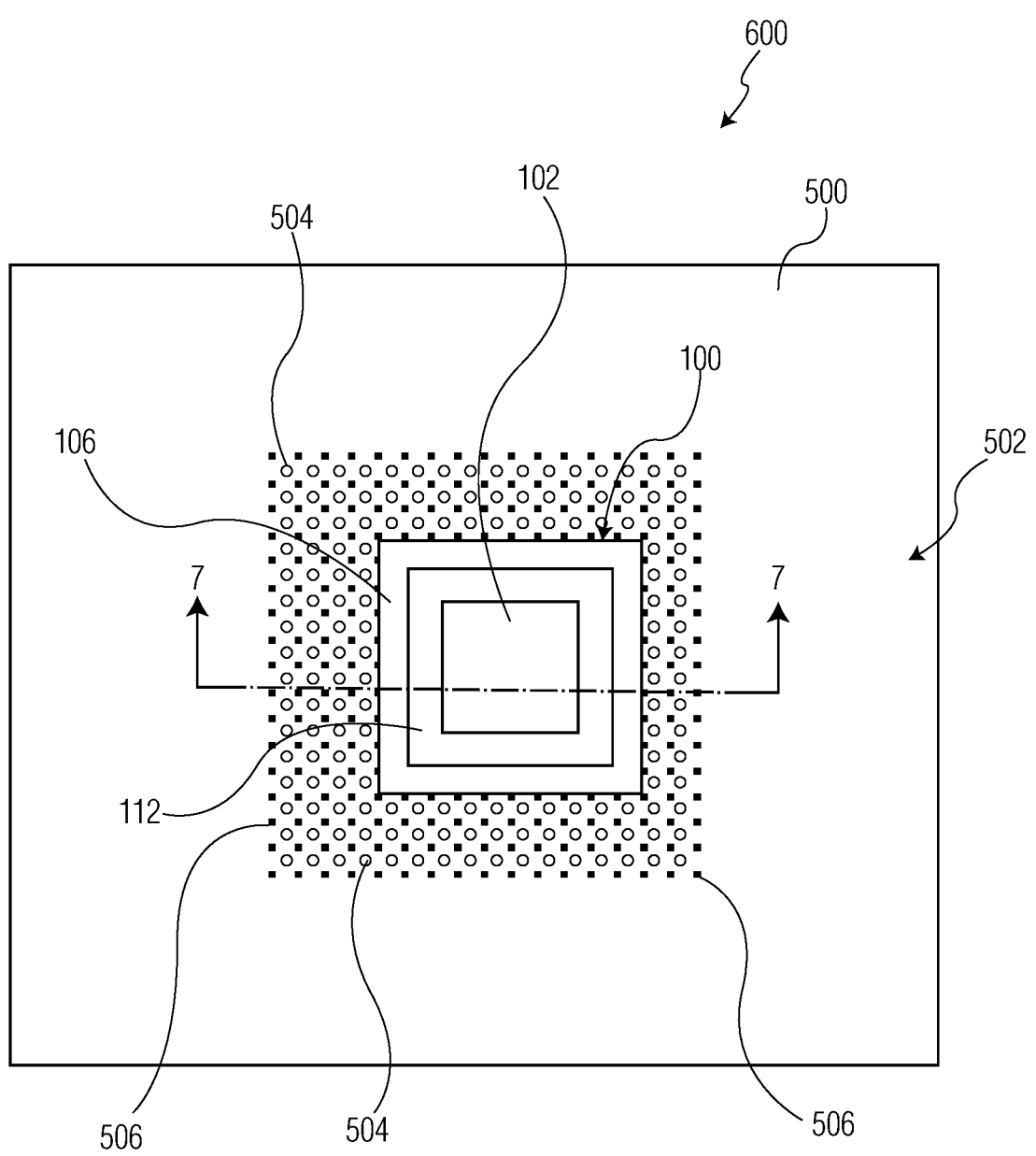
FIG. 6 shows a top view of a system that includes the semiconductor package device of FIGS. 1-3 mounted to the substrate of FIG. 5.
Figure 7:
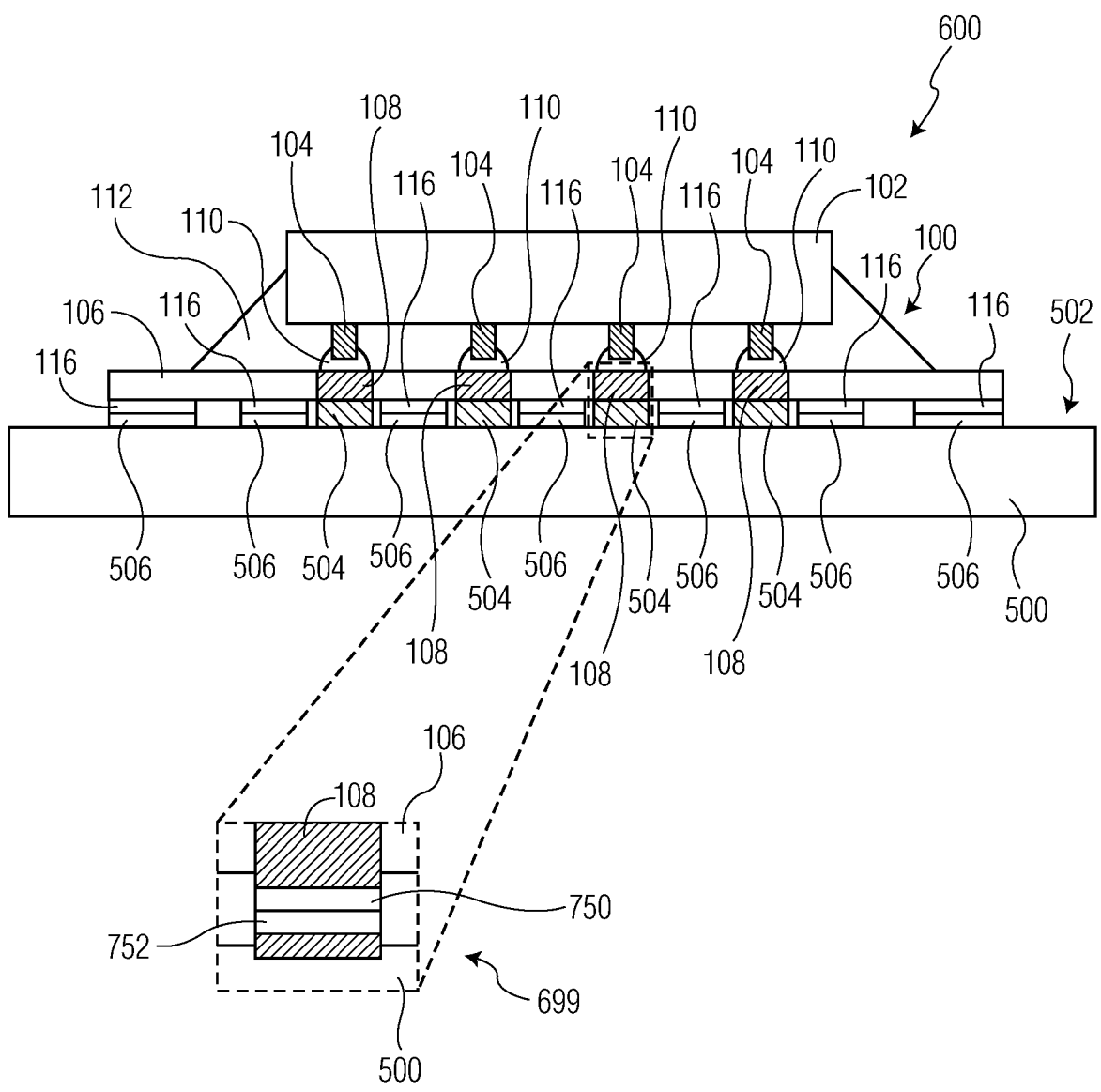
FIG. 7 shows a cross-sectional view of the system of FIG. 6.

For example, FIG. 6 shows a top view of system 600 that includes semiconductor package 100 of FIGS. 1-3 mounted to 500 of FIG. 5. FIG. 7 shows a cross-sectional view of system 600 taken along line 7-7 of FIG. 6. As depicted, semiconductor package device 100 is mounted to device substrate 500 at least partially by the magnetic attraction force generated between magnetic deposits 116 of semiconductor package device 100 and magnetic deposits 506 of device substrate 500. In that arrangement, several through-hole vias 108 of semiconductor package device 100 are placed in electrical communication with (and, in essentially all cases, in physical contact with) landing pads 504 of device substrate 500. In this configuration, the electronic device that incorporated system 600 can operate normally. However, if the electronic device eventually requires repair or refurbishment, semiconductor package device 100 can easily be removed from device substrate 500 by simply mechanically separating semiconductor package device 100 from device substrate 500 without any need to desolder or perform other complex, expensive and/or time-consuming processes (e.g., sawing, breaking, laser etching) to remove semiconductor package device 100 from device substrate 500. In this manner, semiconductor package device 100 may be easily replaced with another semiconductor package to effect a repair or upgrade, or all semiconductor packages mounted to 500 may be easily removed enabling reuse or redeployment of device substrate 500 into other electronic devices or applications.

It should be noted that in this configuration, it may only be required that one of magnetic deposit 116 and magnetic deposits 506 comprise a permanent magnetic material (i.e., a material that is inherently magnetic) while the other of magnetic deposit 116 and magnetic deposits 506 includes a material that is capable of being magnetized.

In real-world applications, it is anticipated that the lengths of the several through-hole vias 108 of semiconductor package device 100 may vary, even by microscopic distances. This could create problems, for example, should one of the through-hole vias 108 be significantly longer than the others. In that case, the longest of the through-hole vias 108 may be placed in physical contact with a corresponding landing pad 504, but the other through-hole vias 108 may not reach to make physical (and electrical) contact with their corresponding landing pads 504. To mitigate this problem, one or more of several through-hole vias 108 and landing pads 504 may comprise a slightly deformable material, such as a tin solder, that may be deposited over a surface of or integrated into through-hole vias 108 and/or landing pads 504 as a coating and protrudes beyond the bottom surface of the package base 106 of semiconductor package device 100 enabling the tips of the several through-hole vias 108 and/or landing pads 504 to deform slightly to ensure that all several through-hole vias 108 are placed in physical and electrical contact with landing pads 504 when semiconductor package device 100 is mounted to device substrate 500. In an embodiment, the thickness of such a deformable layer may be in the range of 1 to 2 microns or in the range of a few hundredths of a nanometer, although other thicknesses of such deformable conductive materials may be utilized. In various embodiments, the deformable layer may have a Rockwell hardness number of 16 HB or less.

In some embodiments, a soft solder layer may be deposited on the outer surfaces of several through-hole vias 108 and landing pads 504 to provide the required conductive interlocking between the terminals. Specifically, within FIG. 7, an enlarged view of the region of system 600 designated by dashed box 799 is shown. As illustrated, a thin layer of solder 750, 752 may be formed over the outer surface of through-hole vias 108 and/or landing pads 504. The thin layer of solder 750, 752 may be at least partially deformable to ensure good electrical connections are formed between the various pairs of through-hole vias 108 and landing pads 504. In such an implementation and, as illustrated by enlarged region 699, the through-hole vias 108 and landing pads 504 may protrude slighting from the surfaces of package base 106 and device substrate 500, respectively. In a complementary manner, the magnetic material of magnetic deposit 116 and magnetic deposits 506 may similarly protrude out of the plane of package base 106 and device substrate 500, respectively.

Figure 8:
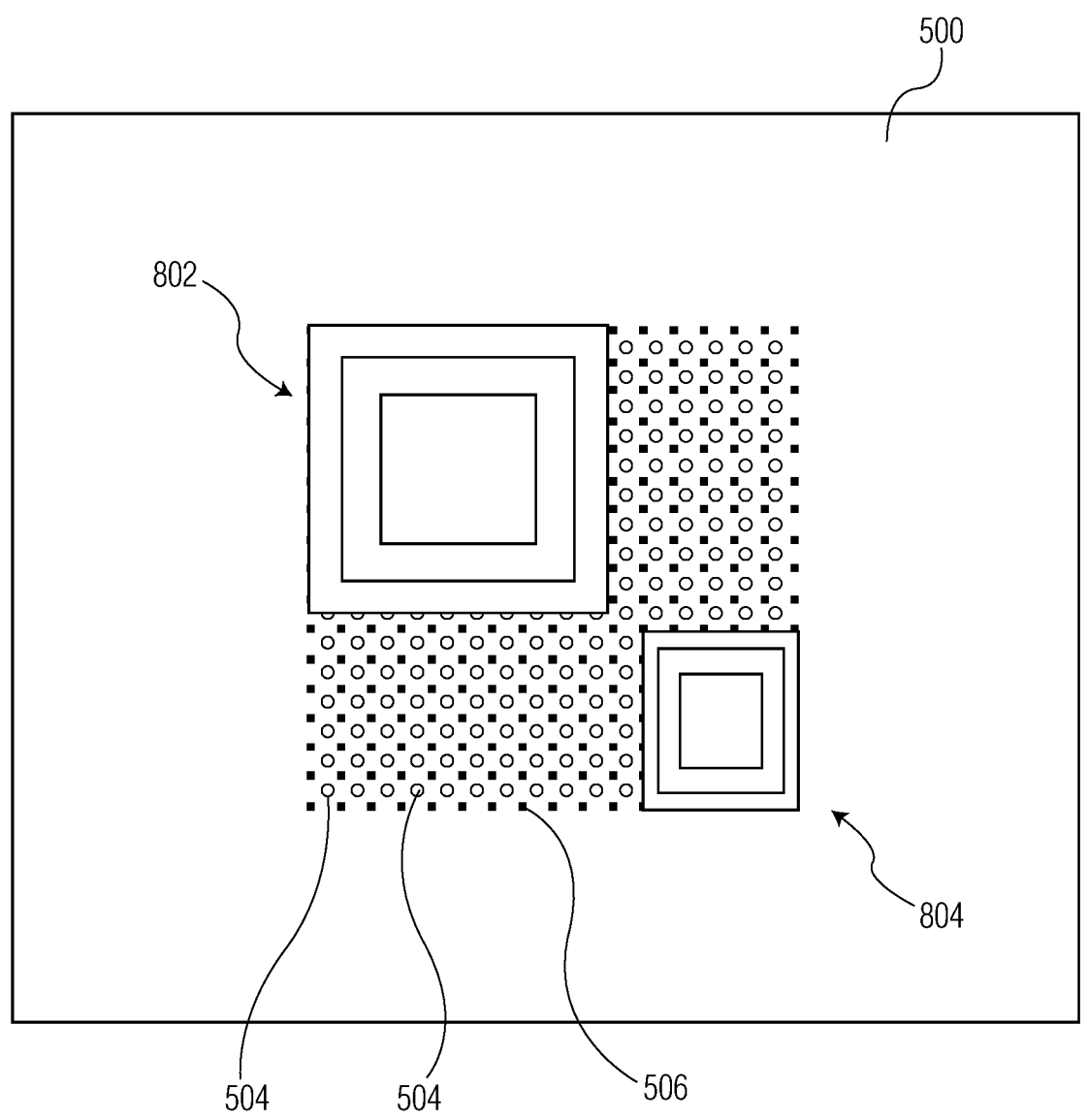
FIG. 8 depicts the substrate of FIGS. 5-7 with different semiconductor packages mounted thereto.

FIG. 8 depicts the substrate 500 of FIGS. 5-7 with different semiconductor packages 802 and 804 mounted thereto. As illustrated, because substrate includes a plurality of magnetic deposits 506, semiconductors with complementary magnetic deposits formed over a bottom surface of the packages can be mounted to substrate 500.

To ensure that the several through-hole vias 108 of any packages mounted to substrate 500 are placed in proper electrical communication with the correct landing pads 504 of device substrate 500, consideration should be made as to the layout pattern of the magnetic material and the through-hole vias and landing pads on the substrate and semiconductors that are configured to be mounted to the substrate.

In various embodiments, the layout of landing pads 504 and magnetic deposits 506 on a particular substrate 500 may be arranged according to predetermined standard layouts (e.g., to mimic the standard pin configurations for particular classes of semiconductor packages or other electronic devices). With a standard layout, a single design of device substrate 500 may be implemented that allows the device substrate 500 to be used in conjunction with a number of different types of semiconductor packages and devices. As such, device substrate 500 can be manufactured with particular landing pads 504 and magnetic deposits 506 layouts enables the device substrate 500 to be reusable in a number of different types of electronic devices and systems.

Traditional manufacturing processes like sputtering or electroplating including lithography and etching, ink jet printing, roller coating, etc. may be used to deposit the magnetic material over a substrate. For a given substrate with a particular landing pad/pin and magnetic material layout, a product designer may use a predetermined substrate layout/configuration when designing a new product such that the product pin layout and magnetic materials are compatible with the same landing pad/pinout design of the substrate.

In addition to enabling magnetic mounting of semiconductor packages, the present disclosure contemplates that the techniques disclosed herein may be used to enable the mounting of other types of electronic devices, such as integrated passive devices (IPDs), to a substrate via a magnetic coupling.

Figure 9:
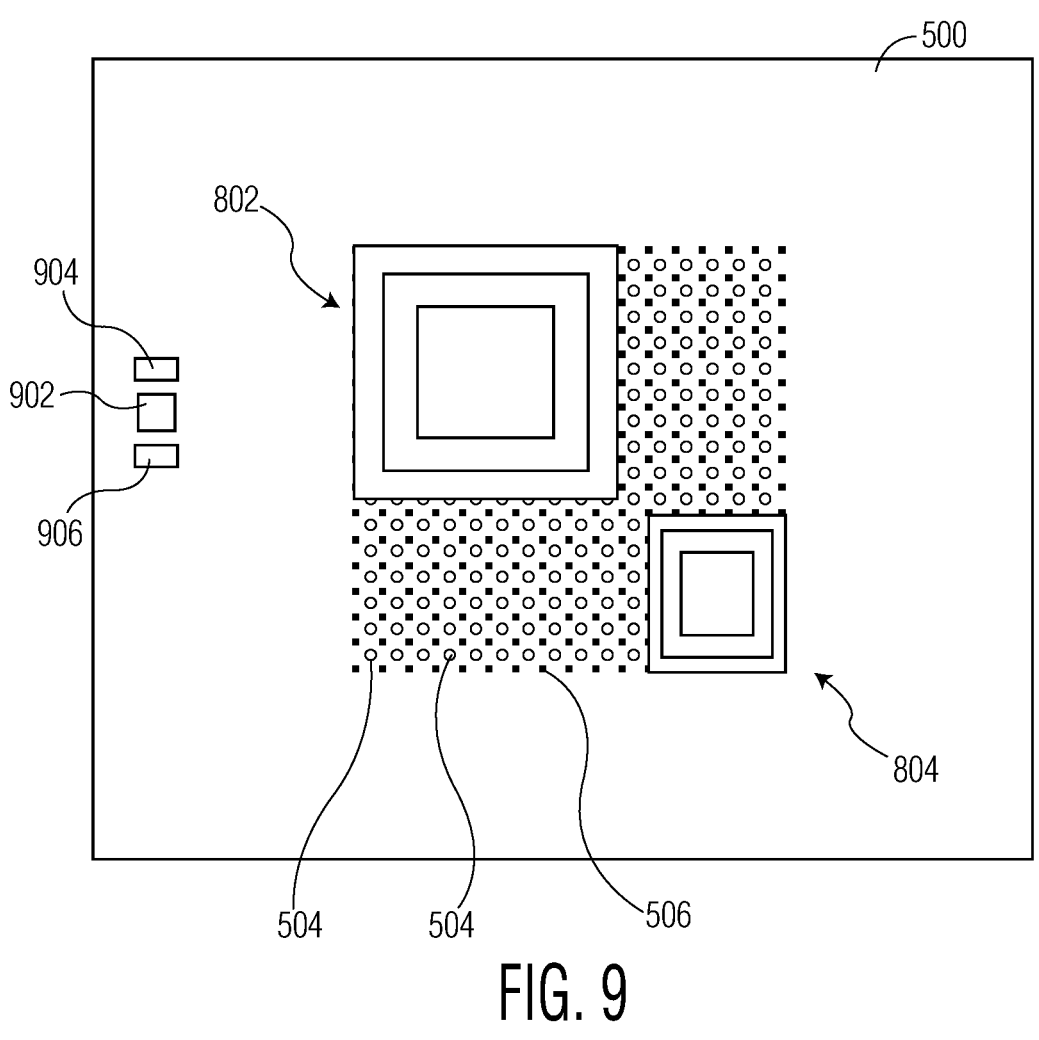
FIG. 9 shows the substrate with mounted semiconductor packages of FIG. 8, where the substrate has been modified to include a mounting area for an integrated passive device (IPD).
Figure 10:
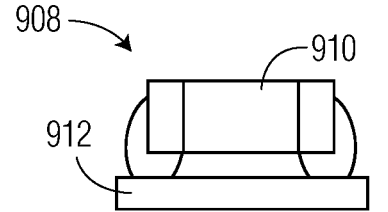
FIG. 10 shows a side view of an IPD that is configured to mount to a substrate.
Figure 11:
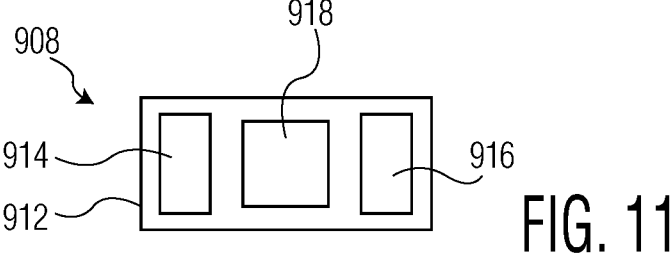
FIG. 11 shows a bottom view of the IPD of FIG. 10.

To illustrate, FIG. 9 shows the substrate 500 and different semiconductor packages 802 and 804 of FIG. 8, where substrate 500 has been modified to include a mounting area for an IPD. Specifically, magnetic deposit 902 is formed on a surface device substrate 500. Two contact pads 904 and 906 are formed over the surface of substrate 500 in proximity to magnetic deposit 902. Contact pads 904 and 906 may be electrically connected to various conductive traces and components incorporated into device substrate 500 or mounted to device substrate 500, as necessary. FIG. 10 shows a side view of IPD 908 that is configured to mount to substrate 500. FIG. 11 shows a bottom view of IPD 908 of FIG. 10.

IPD 908 includes a passive device 910 (e.g., a capacitor, inductor, resistor, or combinations thereof) mounted to IPD substrate 912. As shown in FIG. 11, the bottom surface of IPD substrate 912 includes conductive terminals 914 and 916. Conductive terminals 914 and 916 are electrically connected to complementary terminals of passive device 910.

Between conductive terminals 914 and 916, magnetic material 918 is formed over the bottom surface of IPD substrate 912.

In this configuration, IPD 908 can be mounted to substrate by bringing magnetic material 918 of IPD 908 in proximity to magnetic deposit 902 of device substrate 500. In proximity, the magnetic materials experience an attractive force that holds IPD 908 on the surface of substrate 500 thereby placing conductive terminals 914 and 916 in physical contact (and electrical connection) with two contact pads 904 and 906. This electrically interconnects passive device 910 of IPD 908 with other components and circuitry of device substrate 500.

Figure 12:
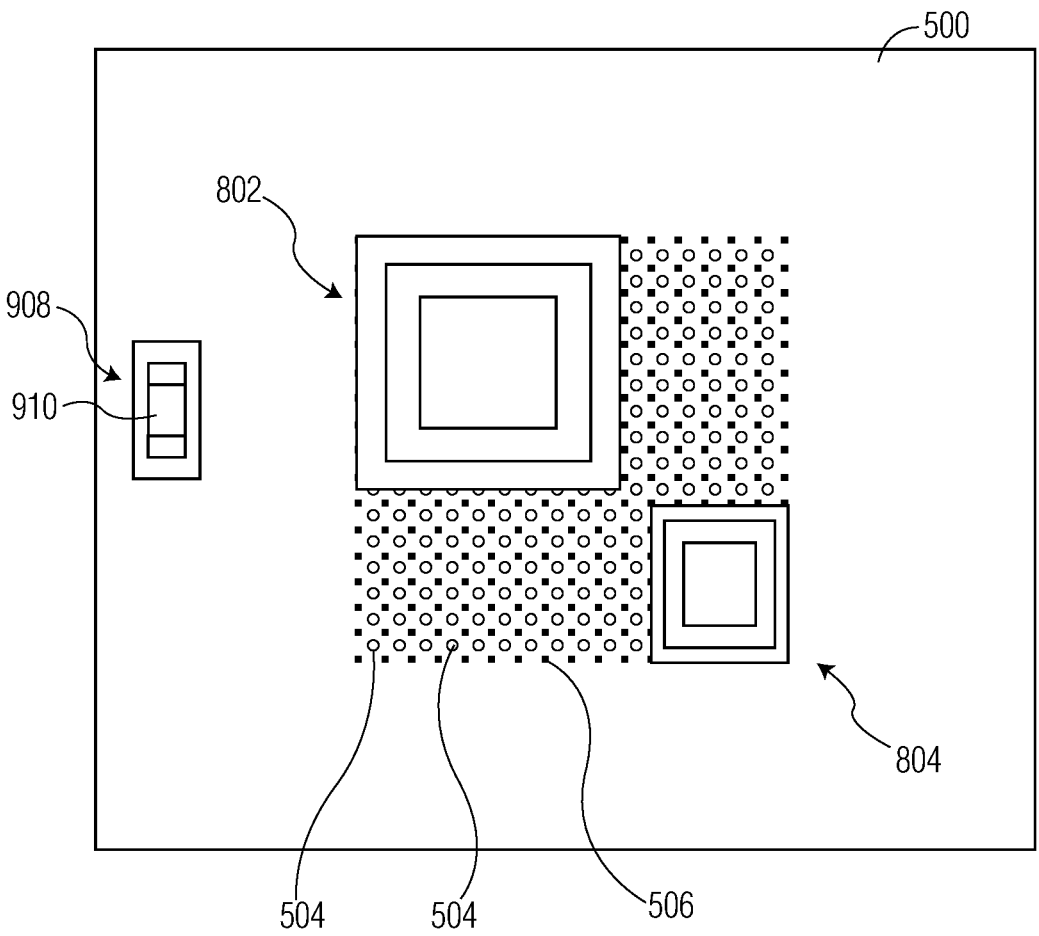
FIG. 12 depicts the substrate of FIG. 9 with an IPD attached.

In the event that IPD 908 is to be replaced (e.g., due to upgrade or to replace a malfunctioning IPD 908), IPD 908 can be removed from device substrate 500 by a mechanical force that separates IPD 908 from substrate 500 enabling a different IPD to be installed onto device substrate 500. FIG. 12 depicts substrate 500 of FIG. 9 with IPD 908 attached.

In some aspects, the techniques described herein relate to a system, including: a multi-layer printed circuit board (PCB), including: a plurality of laminated layers, a plurality of electrical interconnect pads on an outer surface of the plurality of laminated layers, and a first plurality of magnetic material deposits on the outer surface of the plurality of laminated layers; and a device coupled to the PCB, wherein the device includes: an electronic component including a plurality of terminals, a base including a plurality of through-hole vias, wherein each through-hole via of the plurality of through-hole vias is electrically connected to a terminal of the plurality of terminals, wherein the electronic component is mounted to a first surface of the base, and a second plurality of magnetic material deposits on a second surface of the base, wherein the second surface is opposite the first surface, wherein when the device is coupled to the PCB, each magnetic material deposit of the first plurality of magnetic material deposits is attracted by a magnetic force to a magnetic material deposit of the second plurality of magnetic deposits and each through-hole via of the plurality of through-hole vias is electrically connected to an electrical interconnect pad of the plurality of electrical interconnect pads, wherein at least one of the magnetic material deposits of the first plurality of magnetic material deposits and the magnetic material deposits of the second plurality of magnetic material deposits includes a permanent magnetic material.

In some aspects, the techniques described herein relate to a device, including: an electronic component including a plurality of terminals, a base including a plurality of through-hole vias, wherein each through-hole via of the plurality of through-hole vias is electrically connected to a terminal of the plurality of terminals, wherein the electronic component is mounted to a first surface of the base, and a first plurality of magnetic material deposits on a second surface of the base, wherein the second surface is opposite the first surface, wherein the device is configured to couple to a substrate, wherein: the substrate includes a plurality of electrical interconnect pads on an outer surface of the substrate, and a second plurality of magnetic material deposits on the outer surface of the substrate, when the device is coupled to the substrate, each magnetic material deposit of the first plurality of magnetic material deposits is attracted by a magnetic force to a magnetic material deposit of the second plurality of magnetic deposits and each through-hole via of the plurality of through-hole vias is electrically connected to an electrical interconnect pad of the plurality of electrical interconnect pads, and at least one of the magnetic material deposits of the first plurality of magnetic material deposits and the magnetic material deposits of the second plurality of magnetic material deposits includes a permanent magnetic material.

In some aspects, the techniques described herein relate to a device, including: a substrate, including: a plurality of laminated layers, a plurality of electrical interconnect pads on an outer surface of the plurality of laminated layers, and a first plurality of magnetic material deposits on the outer surface of the plurality of laminated layers.

As will be appreciated by one skilled in the art, aspects of the present disclosure may be embodied as a system, process, method, and/or program product. Accordingly, various aspects of the present disclosure (e.g., the machine learning system) may take the form of an entirely hardware embodiment, an entirely software embodiment (including firmware, resident software, micro-code, etc.), or embodiments combining software and hardware aspects, which may generally be referred to herein as a "circuit," "circuitry," "module," or "system." Furthermore, aspects of the present disclosure may take the form of a program product embodied in one or more computer readable storage medium(s) having computer readable program code embodied thereon. (However, any combination of one or more computer readable medium(s) may be utilized. The computer readable medium may be a computer readable signal medium or a computer readable storage medium.)

A computer readable storage medium may be, for example, but not limited to, an electronic, magnetic, optical, electromagnetic, infrared, biologic, atomic, or semiconductor system, apparatus, controller, or device, or any suitable combination of the foregoing, wherein the computer readable storage medium is not a transitory signal per se. More specific examples (a non-exhaustive list) of the computer readable storage medium may include the following: an electrical connection having one or more wires, a portable computer diskette, a hard disk, a random access memory ("RAM"), a read-only memory ("ROM"), an erasable programmable read-only memory ("EPROM" or flash memory), an optical fiber, a portable compact disc read-only memory ("CD-ROM"), an optical storage device, a magnetic storage device, or any suitable combination of the foregoing. In the context of this document, a computer readable storage medium may be any tangible medium that can contain or store a program for use by or in connection with an instruction execution system, apparatus, controller, or device. Program code embodied on a computer readable signal medium may be transmitted using any appropriate medium, including but not limited to wireless, wire line, optical fiber cable, RF, etc., or any suitable combination of the foregoing.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, controller, or device.

The block diagrams in the figures illustrate architecture, functionality, and operation of possible implementations of circuitry, systems, methods, processes, and program products according to various embodiments of the present disclosure. In this regard, certain blocks in the block diagrams may represent a module, segment, or portion of code, which includes one or more executable program instructions for implementing the specified logical function(s). It should also be noted that, in some implementations, the functions noted in the blocks may occur out of the order noted in the figures. For example, two blocks shown in succession may, in fact, be executed substantially concurrently, or the blocks may sometimes be executed in the reverse order, depending upon the functionality involved.

Modules implemented in software for execution by various types of processors may, for instance, include one or more physical or logical blocks of computer instructions, which may, for instance, be organized as an object, procedure, or function. Nevertheless, the executables of an identified module need not be physically located together, but may include disparate instructions stored in different locations which, when joined logically together, include the module, and achieve the stated purpose for the module. Indeed, a module of executable code may be a single instruction, or many instructions, and may even be distributed over several different code segments, among different programs, and across several memory devices. Similarly, operational data (e.g., knowledge bases of adapted weights and/or biases described herein) may be identified and illustrated herein within modules, and may be embodied in any suitable form and organized within any suitable type of data structure. The operational data may be collected as a single data set, or may be distributed over different locations including over different storage devices. The data may provide electronic signals on a system or network.

These program instructions may be provided to one or more processors and/or controller(s) of a general-purpose computer, special purpose computer, or other programmable data processing apparatus (e.g., controller) to produce a machine, such that the instructions, which execute via the processor(s) of the computer or other programmable data processing apparatus, create circuitry, or means for implementing the functions/acts specified in the block diagram block or blocks.

It will also be noted that each block of the block diagrams, and combinations of blocks in the block diagrams, can be implemented by special purpose hardware-based systems (e.g., which may include one or more graphics processing units) that perform the specified functions or acts, or combinations of special purpose hardware and computer instructions. For example, a module may be implemented as a hardware circuit including custom VLSI circuits or gate arrays, off-the-shelf semiconductors such as logic chips, transistors, controllers, or other discrete components. A module may also be implemented in programmable hardware devices such as field programmable gate arrays, programmable array logic, programmable logic devices, application specific ICs, microcontrollers, systems on a chip, general purpose processors, microprocessors, or the like.

Computer program code, i.e., instructions, for carrying out operations for aspects of the present disclosure may be written in any combination of one or more programming languages, including an object-oriented programming language such as Java, Smalltalk, Python, C++, or the like, conventional procedural programming languages, such as the "C" programming language or similar programming languages, or any of the machine learning software disclosed herein.

These program instructions may also be stored in a computer readable storage medium that can direct a computer system, other programmable data processing apparatus, controller, or other devices to function in a particular manner, such that the instructions stored in the computer readable medium produce an article of manufacture including instructions which implement the functions/acts specified in the block diagram block or blocks.

The program instructions may also be loaded onto a computer, other programmable data processing apparatus, controller, or other devices to cause a series of operational steps to be performed on the computer, other programmable apparatus or other devices to produce a computer implemented process such that the instructions which execute on the computer, other programmable apparatus, or other devices provide processes for implementing the functions/acts specified in the block diagram block or blocks.

The preceding detailed description is merely illustrative in nature and is not intended to limit the embodiments of the subject matter or the application and uses of such embodiments.

As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed:

1. A system, comprising:
   a multi-layer printed circuit board (PCB), including:
      a plurality of laminated layers,
      a plurality of electrical interconnect pads on an outer surface of the plurality of laminated layers, and
      a first plurality of magnetic material deposits on the outer surface of the plurality of laminated layers; and
   a device coupled to the PCB, wherein the device includes:
      an electronic component including a plurality of terminals,
      a base including a plurality of through-hole vias, wherein each through-hole via of the plurality of through-hole vias is electrically connected to a terminal of the plurality of terminals, wherein the electronic component is mounted to a first surface of the base, wherein each through-hole via of the plurality of through-hole vias includes a solder material, and
      a second plurality of magnetic material deposits on a second surface of the base, wherein the second surface is opposite the first surface, wherein when the device is coupled to the PCB, each magnetic material deposit of the first plurality of magnetic material deposits is attracted by a magnetic force to a magnetic material deposit of the second plurality of magnetic deposits and each through-hole via of the plurality of through-hole vias is electrically connected to an electrical interconnect pad of the plurality of electrical interconnect pads, wherein at least one of the magnetic material deposits of the first plurality of magnetic material deposits and the magnetic material deposits of the second plurality of magnetic material deposits includes a permanent magnetic material, wherein when the device is coupled to the PCB the magnetic force causes at least a portion of the solder material to deform.

2. The system of claim 1, wherein the solder material of a first through-hole via of the plurality of through-hole vias has a thickness of at least 1 micron.

3. The system of claim 1, wherein an outer coating of solder of the first through-hole via protrudes beyond the second surface of the base.

4. The system of claim 1, wherein the plurality of through-hole vias include conductive materials having a Rockwell hardness number of 16 HB or less.

5. The system of claim 1, wherein the electronic component includes a semiconductor integrated circuit and the device includes a semiconductor package.

6. The system of claim 1, wherein the first plurality of magnetic material deposits include Nickel, Iron, Cobalt, samarium Cobalt, and/or rare-earth materials such as neodymium.

7. The system of claim 1, wherein at least one of the magnetic material deposits of the first plurality of magnetic material deposits surrounds at least one electrical interconnect pad of the plurality of electrical interconnect pads.

8. A device, comprising:
an electronic component including a plurality of terminals,
a base including a plurality of through-hole vias, wherein each through-hole via of the plurality of through-hole vias is electrically connected to a terminal of the plurality of terminals, wherein the electronic component is mounted to a first surface of the base, wherein each through-hole via of the plurality of through-hole vias includes a solder material and an outer coating of the solder material of the first through-hole via protrudes beyond a second surface of the base, and
a first plurality of magnetic material deposits on the second surface of the base, wherein the second surface is opposite the first surface, wherein the device is configured to couple to a substrate, wherein:
the substrate includes a plurality of electrical interconnect pads on an outer surface of the substrate, and a second plurality of magnetic material deposits on the outer surface of the substrate,
when the device is coupled to the substrate, each magnetic material deposit of the first plurality of magnetic material deposits is attracted by a magnetic force to a magnetic material deposit of the second plurality of magnetic deposits and each through-hole via of the plurality of through-hole vias is electrically connected to an electrical interconnect pad of the plurality of electrical interconnect pads, and
at least one of the magnetic material deposits of the first plurality of magnetic material deposits and the magnetic material deposits of the second plurality of magnetic material deposits includes a permanent magnetic material.

9. The device of claim 8, wherein the solder material of a first through-hole via of the plurality of through-hole vias has a thickness of at least 1 micron.

10. The device of claim 8, wherein the plurality of through-hole vias include conductive materials having a Rockwell hardness number of 16 HB or less.

11. The device of claim 8, wherein the electronic component includes a semiconductor integrated circuit and the device includes a semiconductor package.

12. The device of claim 8, wherein the first plurality of magnetic material deposits include Nickel, Iron, Cobalt, samarium Cobalt, and/or rare-earth materials such as neodymium.

13. A device, comprising:
a substrate, including:
a plurality of laminated layers,
a plurality of electrical interconnect pads on an outer surface of the plurality of laminated layers, and
a first plurality of magnetic material deposits on the outer surface of the plurality of laminated layers; and
an electronic component, including:
a plurality of terminals,
a base including a plurality of through-hole vias, wherein each through-hole via of the plurality of through-hole vias includes a solder material, wherein the electronic component is mounted to a first surface of the base, and
a second plurality of magnetic material deposits on a second surface of the base, wherein the second surface is opposite the first surface, wherein when the electronic component is coupled to the substrate, each magnetic material deposit of the first plurality of magnetic material deposits is attracted by a magnetic force to a magnetic material deposit of the second plurality of magnetic deposits and each through-hole via of the plurality of through-hole vias is electrically connected to an electrical interconnect pad of the plurality of electrical interconnect pads, wherein at least one of the magnetic material deposits of the first plurality of magnetic material deposits and the magnetic material deposits of the second plurality of magnetic material deposits includes a permanent magnetic material, wherein when the electronic component is coupled to the substrate the magnetic force causes at least a portion of the solder material to deform.

14. The device of claim 13, wherein the electronic component includes a semiconductor integrated circuit and the device includes a semiconductor package.

15. The device of claim 13, wherein the first plurality of magnetic material deposits include Nickel, Iron, Cobalt, samarium Cobalt, and/or rare-earth materials such as neodymium.

16. The device of claim 13, wherein at least one of the magnetic material deposits of the first plurality of magnetic material deposits surrounds at least one electrical interconnect pad of the plurality of electrical interconnect pads.

* * * * *